(12) United States Patent
Ramesh

(10) Patent No.: US 7,696,549 B2
(45) Date of Patent: Apr. 13, 2010

(54) BISMUTH FERRITE FILMS AND DEVICES GROWN ON SILICON

(75) Inventor: Ramamoorthy Ramesh, Moraga, CA (US)

(73) Assignee: University of Maryland, College Park, MD (US)

( * ) Notice: Subject to any disclaimer, the term of this patent is extended or adjusted under 35 U.S.C. 154(b) by 907 days.

(21) Appl. No.: 11/297,015

(22) Filed: Dec. 8, 2005

(65) Prior Publication Data

US 2007/0029593 A1 Feb. 8, 2007

Related U.S. Application Data

(63) Continuation-in-part of application No. 11/197,532, filed on Aug. 4, 2005.

(51) Int. Cl.
*H01L 29/72* (2006.01)
(52) U.S. Cl. .............. 257/295; 257/296; 257/613; 257/614; 257/615; 257/763
(58) Field of Classification Search .......... 257/295, 257/296, 613, 614, 615, 763
See application file for complete search history.

(56) References Cited

U.S. PATENT DOCUMENTS

| | | | |
|---|---|---|---|
| 5,777,356 A | 7/1998 | Dhote et al. | 257/295 |
| 6,432,546 B1 | 8/2002 | Ramesh et al. | 428/448 |
| 6,518,609 B1 * | 2/2003 | Ramesh | 257/295 |
| 6,610,549 B1 | 8/2003 | Aggarwal et al. | 438/3 |
| 6,642,539 B2 | 11/2003 | Ramesh et al. | 257/63 |
| 6,781,176 B2 | 8/2004 | Ramesh | 257/295 |

OTHER PUBLICATIONS

R. A. McKee et al., "Crystalline Oxides on Silicon: The first five monolayers", *Physical Review Letters*, vol. 81, No. 14, Oct. 5, 1998, 3014-3017 pp.

K. Eisenbeiser et al., "Field effect transistors with $SrTiO_3$ gate dielectric on Si", *Applied Physics Letters*, vol. 76, No. 10, Mar. 6, 2000, 1324-1326 pp.

Kwi Young Yun et al., "Prominent ferroelectricity of $BiFeO_3$ thin films prepared by pulsed-laser deposition", *Applied Physics Letters*, vol. 83, No. 19, 3981-3983 pp.

J. Wang et al., Epitaxial $BiFeO_3$ multiferroic thin film heterostructures, *Science*, vol. 299, Mar. 14, 2003, 1719-1722 pp.

* cited by examiner

*Primary Examiner*—Edward Wojciechowicz
(74) *Attorney, Agent, or Firm*—Charles Guenzer

(57) ABSTRACT

A functional perovskite cell formed on a silicon substrate layer and including a functional layer of bismuth ferrite ($BiFeO_3$ or BFO) sandwiched between two electrode layers. An optional intermediate template layer, for example, of strontium titanate allows the bismuth ferrite layer to be crystallographically aligned with the silicon substrate layer. Other barrier layers of platinum or an intermetallic alloy produce a polycrystalline BFO layer. The cell may be configured as a non-volatile memory cell or a MEMS structure respectively depending upon the ferroelectric and piezoelectric character of BFO. Lanthanum substitution in the BFO increases ferroelectric performance. The films may be grown by MOCVD using a heated vaporizer.

52 Claims, 6 Drawing Sheets

BISMUTH FERRITE FILMS AND DEVICES GROWN ON SILICON

RELATED APPLICATION

This application is a continuation in part of U.S. patent application Ser. No. 11/197,532, filed Aug. 4, 2005, incorporated herein by reference.

FIELD OF THE INVENTION

The invention relates generally to oxide thin film and devices formed thereby. In particular, the invention relates to thin films having a perovskite crystal structure and being ferroelectric or magnetic and/or exhibiting an interaction with other parameters such as piezoelectricity.

BACKGROUND ART

There has been much recent interest and development in electronic devices incorporating a functional metal oxide layer. Perovskite thin films are particularly useful because many perovskite materials exhibit non-linear behavior such as ferroelectricity or have electrical characteristics that depend on other parameters such that they can be used for sensors or actuators.

One such application is a non-volatile ferroelectric memory as I have described in U.S. Pat. No. 6,518,609, incorporated herein by reference in its entirety. The fundamental structure of a ferroelectric memory includes a thin film of ferroelectric material sandwiched between the electrodes of a capacitor. The ferroelectric material has two polarization states. Once the ferroelectric thin film has been poled into one of the two states, it remains in that state without further application of power. Furthermore, the ferroelectric state can be electrically tested. As a result, a ferroelectric capacitor can act as a non-volatile memory. One of the challenges of commercially important ferroelectric memories addressed in the above cited patent is integrating a large number of such ferroelectric cells on a silicon substrate.

Another important application of perovskite thin films includes micro electromechanical system (MEMS) devices. MEMS technology borrows the fabrication techniques developed for silicon integrated circuits to form small mechanical devices in a silicon layer of a substrate that can move and interact with electrical signals. There are several forms of electromechanical actuation. In one form, a piezoelectric layer is formed over a thin cantilevered silicon layer and is connected between two electrical terminals. A voltage applied across the piezoelectric layer causes it and the silicon layer to flex in a predetermined way. Such a structure has been used to form arrays of movable micromirrors for a communication switch. In a complementary form, the structure can act as a pressure sensor. A pressure differential across the cantilevered structure will cause it to flex. The distortion can be electrically detected as a voltage across the piezoelectric layer in a mechanism similar to a microphone. Again, the challenge is to integrate onto a silicon substrate a significant number of such devices including the piezoelectric layer.

Ferroelectric memories and piezoelectric MEMS structures often use a functional metal oxide layer of a perovskite material. One of the most popular perovskite material for these applications is lead zirconium titanate ($PbZr_xTi_{1-x}O_3$ or PZT) and its related alloys of lead lanthanum niobium zirconium titanate (PLNZT). It is understood the composition of commercially important perovskite materials is often not strictly stoichiometric. There are other devices which incorporate these and similar perovskite materials, such as non-volatile field effect transistors, pyroelectric infrared sensors, other optical devices, pyrometers, and static ferroelectric RAMs.

Almost all these devices benefit from a high quality perovskite film having well defined crystallinity. In U.S. Pat. No. 6,432,546, I and others have disclosed growing high quality PZT on a layer strontium titanate ($SrTiO_3$ or STO) grown over silicon. In U.S. Pat. Nos. 6,518,609 and 6,781,176, I have described doping the STO to be conductive. I and Schlom in U.S. Pat. No. 6,642,539, incorporated herein by reference in its entirety, have disclosed that the doping elements in STO can be chosen from different substituents.

The use of PZT as the functional metal oxide layer presents some difficulties. It contains a high fraction of lead. Lead is toxic and thus raises environmental issues both during fabrication and for disposal of old devices. Furthermore, lead is considered a heavy metal contaminant in the fabrication of silicon integrated circuits and it may introduce reliability problems in semiconductor circuits.

It would be preferred if functional metal oxide layers exhibiting ferroelectricity, piezoelectricity, and other qualities associated with perovskites have a composition not including lead.

SUMMARY OF THE INVENTION

A bismuth ferrite (BFO) (or a chemically substituted derivative of BFO) functional layer may be integrated with a silicon substrate. If desired, it may be crystallographically aligned with the monocrystalline silicon substrate. Lanthanum substitution of the bismuth has provided superior hysteretic characteristics. A template layer, for example of strontium titanate may provide the aligned transition between silicon and the BFO. The BFO functional layer is advantageously sandwiched between electrode layers. At least the lower electrode layer is advantageously formed of a conductive metal oxide, such as strontium ruthenate, which continues the crystallographic orientation between the template layer and BFO functional layer. Such a structure may be fabricated into a ferroelectric memory cell, for example, a ferroelectric layer sandwiched between two electrodes and forming a non-volatile capacitive memory cell.

In another embodiment, the bismuth ferrite functional layer is deposited on an oxide covered silicon substrate. A bottom polycrystalline platinum electrode intermediate the BFO and oxide layer causes the BFO to grow as a polycrystalline material.

In a further embodiment, the bismuth ferrite functional layer is deposited on an intermetallic alloy layer deposited over a silicon layer, for example, a polysilicon plug to an underlying silicon substrate including an active device.

The properties of the BFO layer can be appropriately modified by substitution of bismuth by lanthanum or similar rare earth species.

The integrated cell structure may be configured as a non-volatile memory cell relying upon the ferroelectric nature of BFO or as a MEMS structure relying upon its piezoelectric nature.

DETAILED DESCRIPTION OF THE PREFERRED EMBODIMENTS

The perovskite material bismuth ferrite ($BiFeO_3$ or BFO), also called bismuth iron oxide, can be substituted for PZT and related materials as the functional metal oxide layer in many commercially important devices. The class may be expanded to cover cationically substituted derivatives of BFO, for example, by substituting lanthanum or similar rare-earth elements. The indicated composition of $BiFeO_3$ need not be precise or exactly stoichiometric, as is well known. The perovskite material may also be a cationically substituted derivative of BFO, such as La-substituted BFO. In the bulk, BFO is known to exhibit a rhombohedrally distorted perovskite crystal structure with rhombohedral unit cell parameters of cell length $\alpha=0.56166$ nm and angle $\alpha=59.355°$ and a psuedo-cubic unit lattice of about 0.396 nm. BFO also exhibits a good ferroelectric effect with a high Curie temperature $T_C$ of about 825° C. and some anti-ferromagnetism with a Neel temperature $T_N$ of about 400° C. Recent measurements have shown that (001)-oriented BFO thin films display a ferroelectric polarization of about 55 $\mu C/cm^2$, a value much higher than that of PZT.

Figure 1:
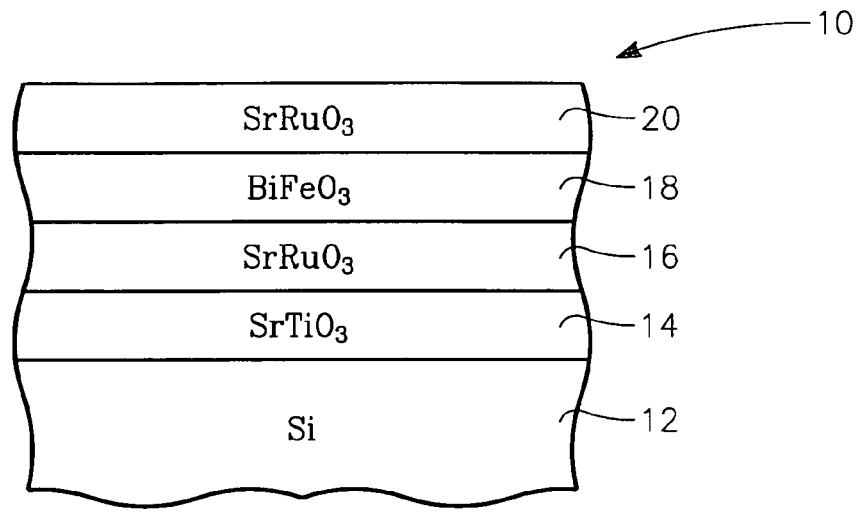
FIG. 1 is a cross-sectional view of a perovskite stack including a bismuth ferrite functional layer grown on a silicon substrate to be crystallographically aligned therewith.

A BFO thin-film structure 10 is illustrated in the cross-sectional view of FIG. 1. A crystalline silicon substrate 12 has a (100)-oriented surface. An undoped strontium titanate ($SrTiO_3$ or STO) layer 14 is grown on the silicon substrate to serve as a template layer, as is described in my above cited patents, preferably using molecular beam epitaxy. The STO layer 14 is strongly crystalline and is observed to grow offset by 45° in the plane, that is, the STO (100) axis is aligned with the (110) axis of silicon. This is easily understood since the (100) lattice constant for STO is 0.391 nm and the (110) lattice spacing for Si is 0.382 nm.

An electrode layer 16 of strontium ruthenate ($SrRuO_3$ or SRO) is deposited on the STO template layer 14 to serve as one of the capacitor plates. SRO has the advantage of growing epitaxially over STO under the proper conditions.

A bismuth ferrite (BFO) ferroelectric layer 18 is grown over the SRO layer 16. Under the proper growth conditions, the BFO layer forms epitaxially with the SRO layer 16. The BFO layer 18 may be formed to thicknesses in the range of 30 to 3000 nm as the functional oxide layer of useful devices.

The structure described to this point was fabricated and physically characterized. Both the SRO and BFO layers 16 were grown by pulsed laser deposition using the parameters of TABLE 1.

TABLE 1

|  | Substrate Temperature (° C.) | Energy Density ($J/cm^2$) | $O_2$ Partial Pressure (mTorr) | Deposition Rate (nm/min) |
|---|---|---|---|---|
| SRO | 650 | 1.2 | 100 | 0.7 |
| BFO | 670 | 1.2 | 40 | 7 |

After deposition, the films were annealed at 390° C. for one hour during cooling at 5° C./min in a one-atmosphere oxygen ambient.

X-ray diffraction demonstrated that the BFO layer 18 was well crystallized with a rotation of 45° with respect to the underlying silicon substrate 12.

Figure 2:
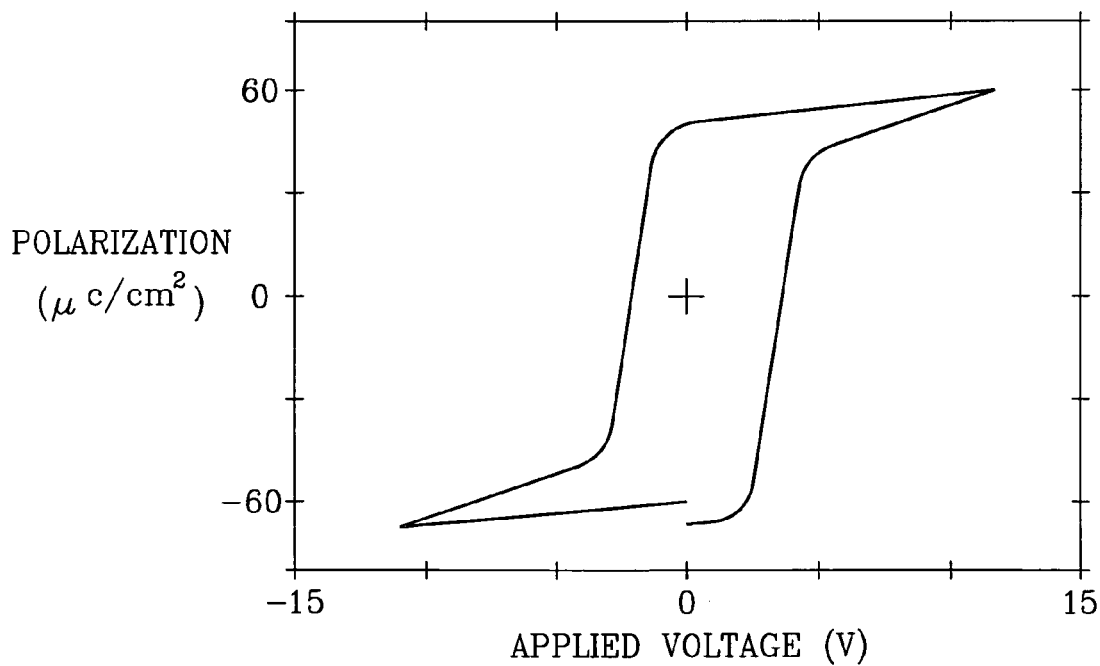
FIG. 2 is a graph of a ferroelectric hysteresis curve measured on the structure of FIG. 1.

The addition of an upper SRO electrode layer 20 allows the ferroelectric parameters of the BFO film 18 to be measured although the use of epitaxial electrode material is not required on the top electrode. The ferroelectric hysteresis curve illustrated in the graph of FIG. 2 was measured on 32 µm-diameter capacitors at a frequency of 15 kHz. The resistivity across the measured voltages is at least $10^9$ ohm-centimeter. The small signal dielectric constant is about 170.

The coercive field, which in undoped material is about 2 to 3V, can be lowered by cationic substitution to the range of 0.7 to 1v often required for memory applications. The cationic substitution tunes the spontaneous distortion of the material. For example, La substitution at the Bi site facilitates this reduction in spontaneous distortion. A similar effect has been observed in PZT. BFO films have been grown and measured with thicknesses varying between 100 and 400 nm. Over this range, the pseudo-cubic lattice constant with increasing thickness decreases from 0.3962 to 0.3948 nm, the switchable polarization ΔP decreases from 90 to 55$\mu C/cm^2$, and the piezoelecfric coefficient $d_{33}$ increases from 25 to 125 pm/V. The piezoelectric coefficient is large enough to make BFO useful for MEMS and actuators.

Figure 3:
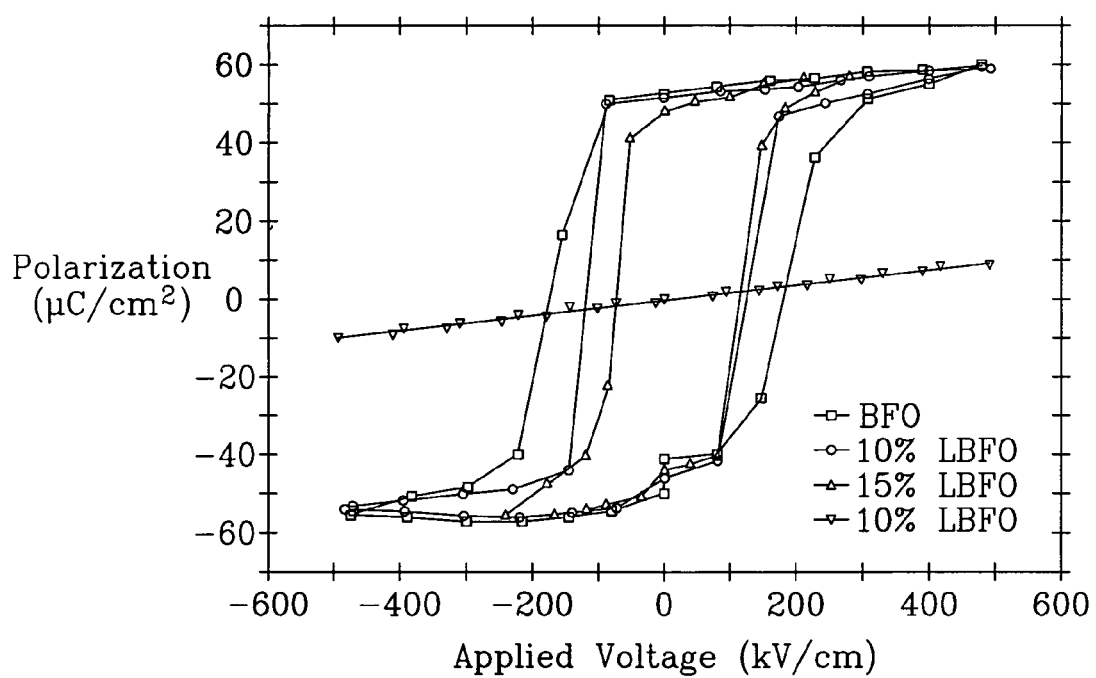
FIG. 3 is a graph of hysteresis curves for various levels of lanthanum substitution for bismuth ferrite in ferroelectric capacitors.

The amount of lanthanum doping has been experimentally observed to significantly affect the polarization characteristics of the ferroelectric capacitive memory cell. Cells were fabricated having ferroelectric layers of pure BFO and with lanthanum substitutions of 10 at %, 15 at %, and 20 at % for the bismuth content. The hysteresis curves measured for these different devices are shown in the graph of FIG. 3. The pure BFO cell provided good results, but those with 10% and 15% lanthanum substitution showed even better results. However, 20% lanthanum substitution effectively destroyed the ferroelectric character. Although the preferred substitution fraction depends on many process variables, a range of greater than 5 at % and less than 20 at % is expected to include the optimum fraction.

Figure 4:
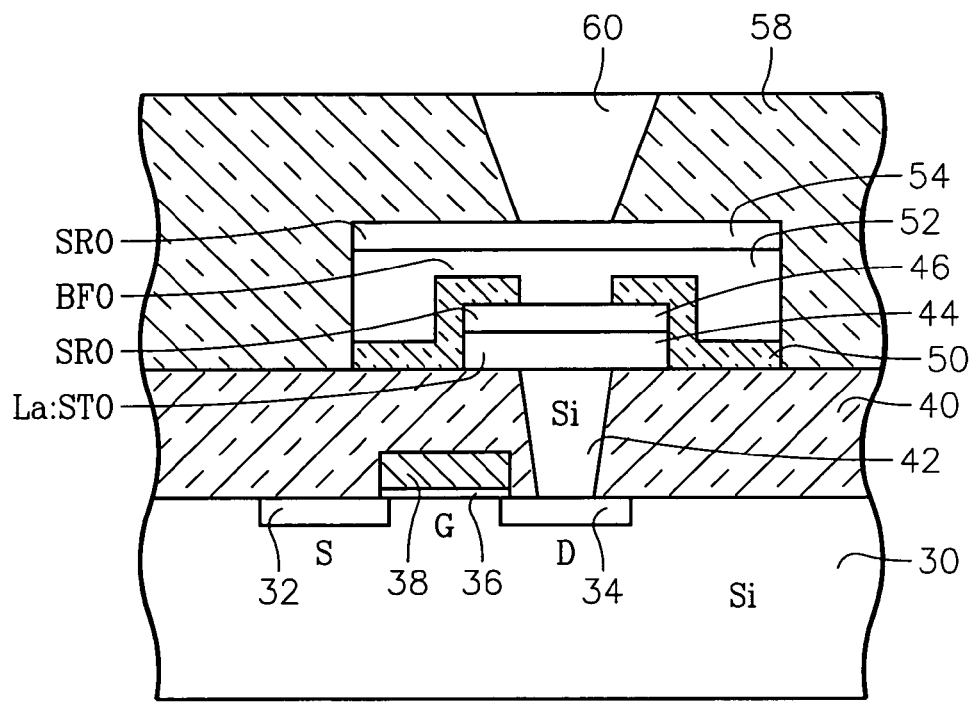
FIG. 4 is a cross-sectional view of a non-volatile ferroelectric memory cell incorporating a bismuth ferrite ferroelectric layer.
Figure 5:
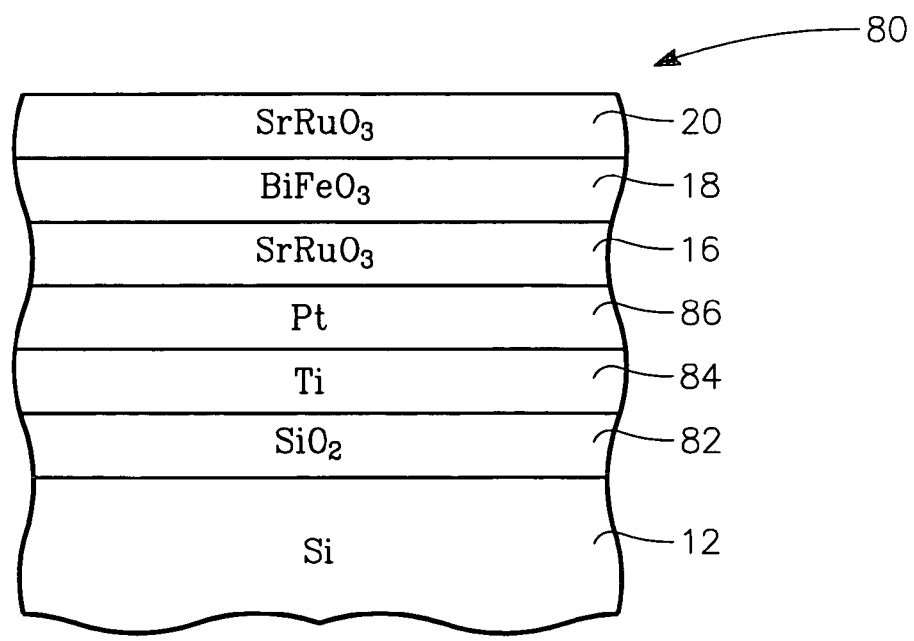
FIG. 5 is a cross-sectional view of a polycrystalline bismuth ferrite structure including a platinum barrier layer.

In FIG. 4 is illustrated in cross section one embodiment of a ferroelectric memory cell utilizing the invention. I have disclosed many features of the overall structure in my cited patents. A large number of memory cells, one of which is illustrated, are formed in an essentially monocrystalline silicon substrate 30. Ion implantation is used to dope a source 32 and drain 34 into the substrate 30. A pass gate transistor structure including a gate oxide 36 and metallization 38 is formed over the gate region between the source 32 and drain 34 to produce a MOS transistor. Electrical power or sensing circuitry is selectively connected to the source 32 by an unillustrated line and is gated by the signal applied to the gate structure through the metallization 38. The transistor structure is then covered with a first-level dielectric layer 40 typically composed of $SiO_2$ or a related silicate glass. A contact hole is etched in the oxide dielectric layer 40 over the transistor drain. A silicon plug 42 is grown to contact the underlying silicon substrate 30 including the MOS transistor. The silicon plug 42 is conductive and except for semiconductor dopants is essentially silicon, that is, greater than 99% at silicon including dopants. It makes electric contact with the transistor drain 34. The silicon plug 42 may be grown to be crystallographically oriented with if not epitaxial to the monocrystalline silicon substrate 30 but often is characterized only as polycrystalline silicon.

The ferroelectric device, in this case, a ferroelectric memory capacitor, is formed over the silicon plug 42. The vertically oriented capacitor is electrically contacted at its bottom through the silicon plug 42 and silicon drain 34 of the transistor structure and at its more exposed top by a second signal line. The dramatic difference in chemistries between the ferroelectric oxides and the underlying silicon necessitates the introduction of a diffusion barrier to eliminate any diffusion of oxygen from the metal oxide ferroelectric layer or other oxide layers to the components of the semiconductor transistor. Even the oxidation of the top of the silicon plug 42 would create an electrically insulating barrier of $SiO_2$ between the ferroelectric capacitor cell and the silicon transistor. The fact that the barrier must be a good electrical conductor and form an Ohmic contact to silicon further complicates the selection of barrier materials.

In one embodiment of the invention, a conductive barrier layer 44 of La-substituted STO is grown to be crystallographically oriented with the silicon plug 42. The conductivity enhancing feature of lanthanum doping is disclosed in the aforecited '539 patent, but other dopants to enhance conductivity are available, such as niobium, as also disclosed in the '539 patent. A conductive metal oxide electrode layer 46, for example, of strontium ruthenate is grown to be crystallographically oriented with the STO barrier layer 44. The STO and SRO layers 44, 46 are etched to form a bottom electrode stack. A shaped diffusion barrier 50, for example, of titanium oxide ($TiO_2$) is deposited and patterned to have an aperture over the top of the lower electrode stack.

A ferroelectric layer 52 of bismuth ferrite (BFO) is then deposited under conditions that it is crystallographically oriented with the underlying electrode stack. If the silicon plug 42 is epitaxial with the silicon wafer 30, the ferroelectric layer 52 is single crystalline and epitaxial with the silicon wafer 30. If the silicon plug 42 is only polycrystalline, nonetheless the ferroelectric layer 52 is well ordered with few surface defects. A top electrode layer 54 is deposited over the BFO layer 54. The top electrode layer 54 may be the conventional platinum, but an SRO top electrode layer 54 is observed to greatly reduce fatigue above $10^6$ switching cycles. The structure is then etched to form a ferroelectric capacitor stack.

An $SiO_2$ inter-level dielectric layer 58 is deposited and patterned to have a via hole overlying the upper electrode layer 54 of the ferroelectric stack and a conductive barrier plug 60 is filled into it to provide an electrical contact to the top of the BFO capacitor. The barrier plug 60 preferably includes at least a barrier portion of platinum or an intermetallic alloy.

Each of the transistor gates 38 or sources 32 and each of the conductive plugs 60 may be individually contacted and separately controlled to provide for both writing, non-volatile storage, and reading of the ferroelectric memory cell.

The structures shown in FIGS. 1 and 3 include the crystalline STO layer and have the advantage of producing a substantially monocrystalline BFO layer. Some devices do not require monocrystalline BFO and do not require electrical contact to the silicon substrate. These devices would benefit from a simpler structure not including STO. For example, a BFO structure can be fabricated on a silicon substrate but not be epitaxial with it or be directly electrically connected to it. The BFO may form as a polycrystalline material, but this may be sufficient for ferroelectric memories and other BFO structures. For example, it is common to deposit polycrystalline silicon (polysilicon) as a contact, such as to an underlying monocrystalline silicon chip.

One such vertical BFO structure 80 is illustrated in the cross-sectional view of FIG. 4. An insulating $SiO_2$ layer 82 is oxidized or deposited by CVD on the crystalline silicon substrate 12. A titanium layer 84 is deposited, typically by sputtering or metal-organic CVD, on the $SiO_2$ layer 82 to provide adequate bonding to the silica. A platinum layer 86 is deposited, typically by sputtering, on the titanium layer 84 and acts as a barrier against the diffusion of oxygen from the $SiO_2$ layer 82. The SRO layer 16 is deposited on the platinum layer 86 to serve as the electrode to the after deposited BFO layer 18. The SRO layer 16 also serves as partial templating layer such the after-grown BFO layer 18 grows with fairly large crystallites and is polycrystalline. A top electrode may be formed from the SRO layer 20 although other electrode materials may be used.

The BFO structure 80 forms part of a hybrid integrated circuit structure in which semiconductor electronics are formed in portions of the silicon substrate 12 away from the BFO structure 80 and are interconnected to the BFO structure by horizontal metal interconnect which contact the top electrode 20 and either the bottom electrode 16 or the metal layers 84, 86.

The BFO structure 80 forms part of a hybrid integrated circuit structure in which semiconductor electronics are formed in portions of the silicon substrate 12 away from the BFO structure 80 and are interconnected to the BFO structure by horizontal metal interconnect which contact the top electrode 20 and either the bottom electrode 16 or the metal layers 84, 86.

Figure 6:
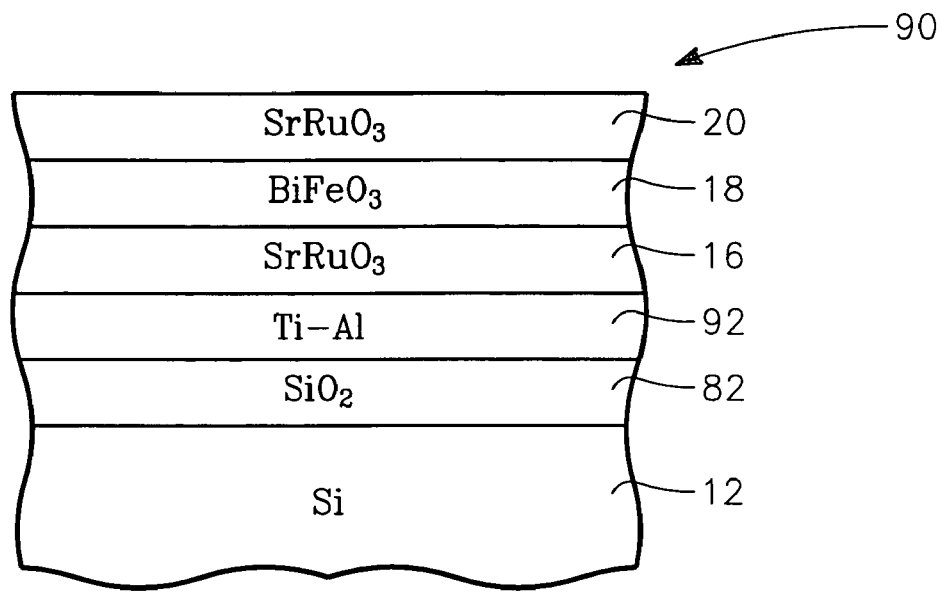
FIG. 6 is a cross-sectional view of a possibly polycrystalline bismuth ferrite structure including an intermetallic barrier layer.

Another BFO structure 90, illustrated in the cross-sectional view of FIG. 6, substitutes an intermetallic layer 92 for the bonding and barrier layers 84, 86. The intermetallic layer 92 may be formed of an alloy of Ti—Al or other intermetallic alloy, as has been disclosed by Dhote et al. in U.S. Pat. No. 5,777,356 and by Ramesh et al. in U.S. Pat. No. 6,610,549, both patents incorporated herein by reference in their entireties. Again, the BFO layer 18 forms as a polycrystalline layer.

Figure 7:
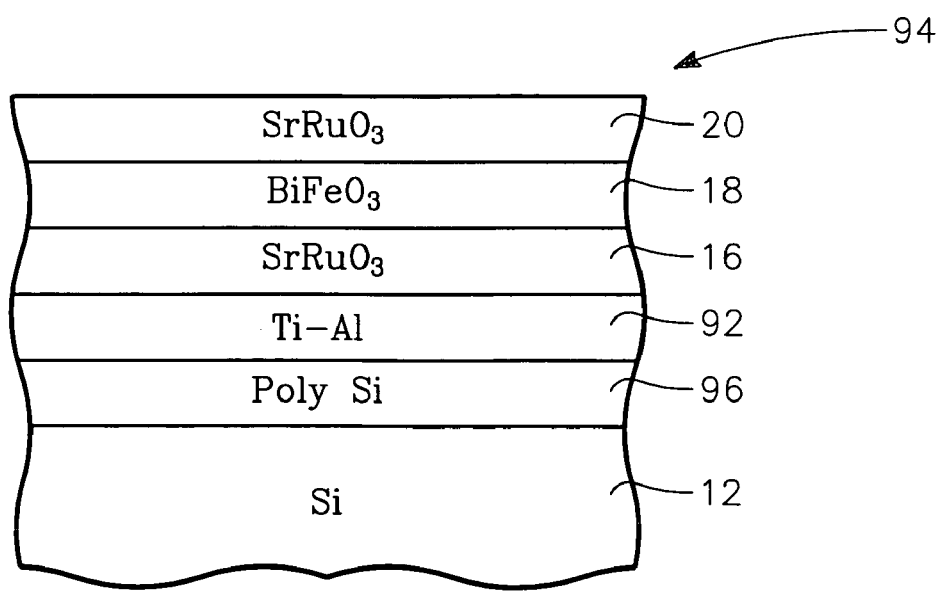
FIG. 7 is a cross-sectional view of a possibly polycrystalline bismuth ferrite structure including the intermetallic barrier layer and a polysilicon layer.
Figure 8:
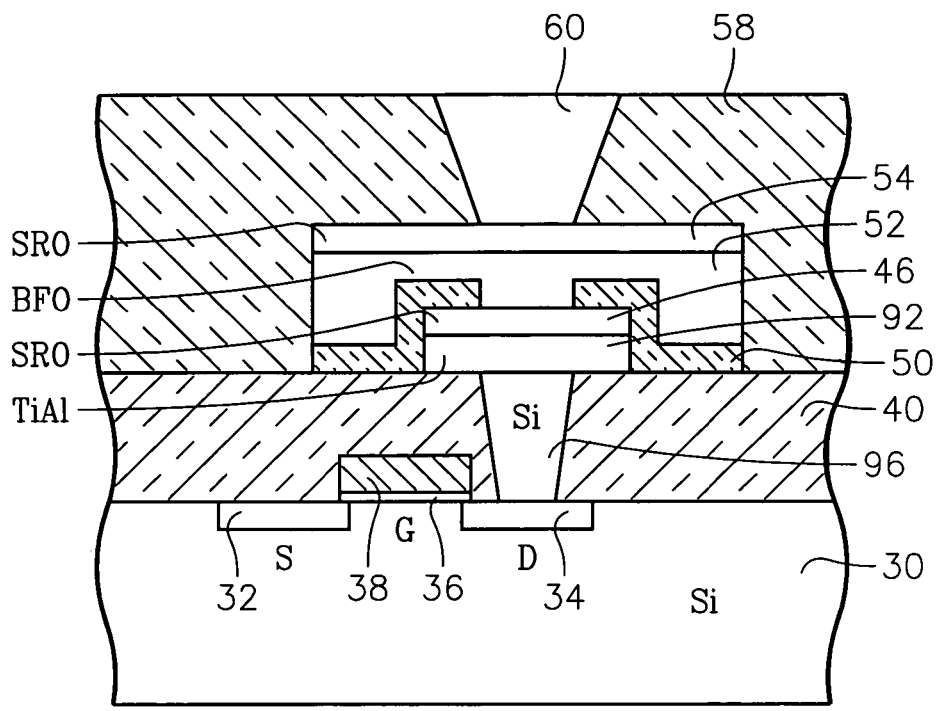
FIG. 8 is a cross-section view of a ferroelectric memory cell incorporating the structure of FIG. 8.

A further BFO structure 94, illustrated in the cross-sectional view of FIG. 7, includes a silicon layer 96 intermediate the monocrystalline silicon substrate 12 and the intermetallic layer 92. The silicon layer 96 may be polycrystalline silicon (polysilicon) and may be in the form of the silicon plug 42 of FIG. 4. In this case, the La:STO layer 44 is replaced by the intermetallic layer 92 to produce the structure shown in the cross-sectional view of FIG. 8 in which the silicon plug 42 provides contact between the bottom of the BFO capacitor and the transistor in the substrate 30 and other circuits formed in the substrate 30 while the barrier plug 60 provides contact from the outside to the top of the BFO capacitor. The composition of the intermetallic layer 92 is not limited to Ti—Al intermetallic alloys but other intermetallic alloys, for instance, those disclosed by Dhote and Ramesh, may be substituted.

Figure 9:
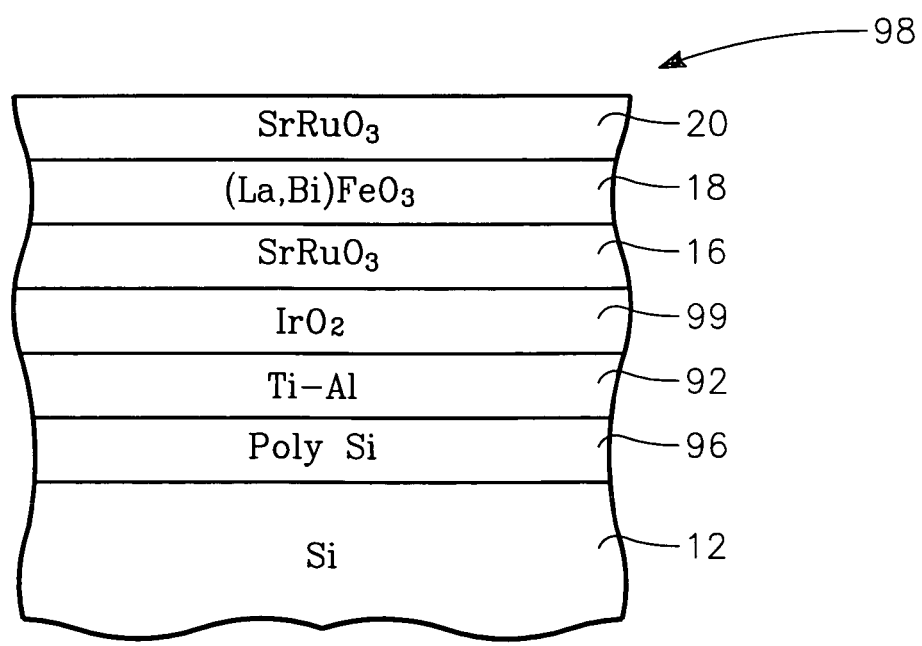
FIG. 9 is a cross-sectional view of a possibly polycrystalline bismuth ferrite structure similar to that of FIG. 7 but also including an iridium oxide layer.

A yet further BFO structure 98, illustrated in the cross-sectional view of FIG. 9 specifically shows the BFO layer 18 to be partially lanthanum substituted (La, Bi)FeO$_3$, as is possible in the previously embodiments including the BFO layer 18. The BFO structure further includes an iridium oxide (IrO$_2$) layer 99 intermediate the polysilicon layer 96 and the lower strontium ruthenate layer 16. Iridium oxide is a well known conductive oxide that has been included in developed manufacturing processes. The lower strontium ruthenate layer 16 may be thin but is desired to serve as a barrier between the iridium oxide and the BFO.

Figure 10:
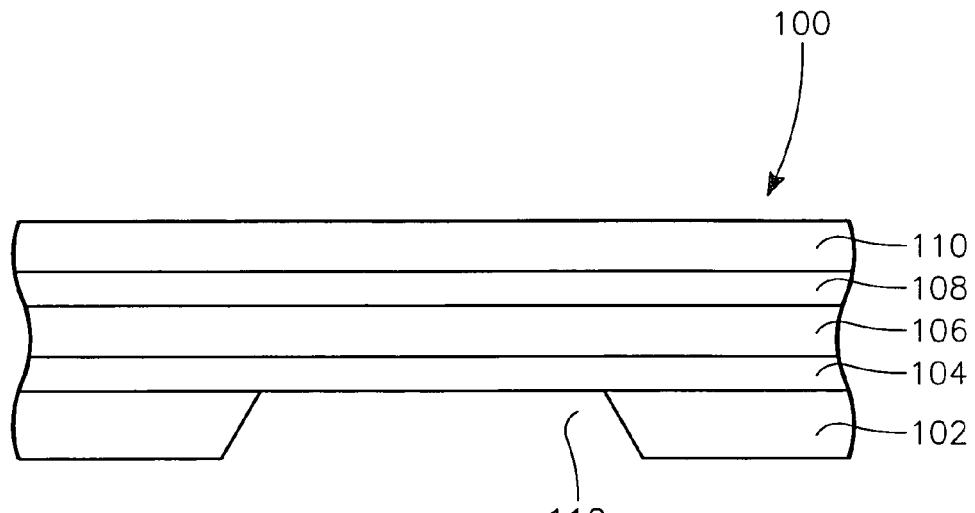
FIG. 10 is a cross-sectional view of a MEMS structure incorporating a bismuth ferrite piezoelectric layer.

Another structure benefitting from the invention is a MEMS structure 100 illustrated in the cross-sectional view of FIG. 10. A crystalline silicon layer 102 may be a silicon wafer or a silicon layer, for example, formed as part of a silicon-on-insulator (SOI) substrate. Particularly in SOI substrates, the silicon layer may not be monocrystalline but only polycrystalline but with large crystallites. On the unpatterned silicon layer 102 are sequentially formed an STO barrier layer 104, a lower electrode layer 106, for example of SRO, a piezoelectric layer 108 of BFO, and an upper electrode layer 110, for example of SRO. In the typical situation in which the STO barrier layer 104 does not need to be conducting, it may remain undoped. The growth conditions are such that the SRO layer 106 and the BFO layer 108 are crystallographically aligned with the silicon layer 102. The back side of the structure is then etched to form an aperture 112 in the silicon layer 102 over which the remaining structure is suspended. The illustrated MEMS structure can be used as a pressure or force sensor. When a differential force is applied across the structure in the area of the aperture 112, the cantilevered layers are deflected and a differential voltage develops between the electrode layers 106, 110 because of the piezoelectric nature of the BFO layer 108. On the other hand, the same MEMS structure can be used as an actuator or electrically movable element. When a voltage is applied between the electrode layers 106, 110, the piezoelectric nature of the BFO layer 108 causes a deflection in the suspended structure. The deflection can be increased by forming the suspended structure to be supported from only one side, that is, to be cantilevered.

The MEMS structure 100 can be modified according to the polycrystalline BFO structures 80, 90, 92, 98 of FIGS. 3-9. As a result, the STO layer 104 can be replaced either by a Ti/Pt bilayer 84, 86 or by an intermetallic layer 92.

As mentioned before, MEMS structures can also be used for optical sensors, bolometers, pyrometers, and many other functions arising from the complex behavior of the perovskite BFO.

The bismuth ferrite required for ferromagnetic applications needs to be of high quality. Such BFO films can be grown by a type of metal-organic chemical vapor deposition (MOCVD) applicable to other complex metal oxide films. This technique involves transporting a metal-organic compound in the vapor phase followed by thermal decomposition on the substrate in the presence of oxygen. The appropriate metal-organic precursor should be selected in order to obtain desired properties and quality of the thin film. The MOCVD precursors should have (1) high vapor pressure at a low vaporization temperature, (2) a low decomposition temperature, (3) a sufficiently large temperature window between vaporization and composition, (4) stability under ambient conditions, and (5) non-toxicity.

Several types of metal-organic compounds have been commonly used as precursors to grown metal oxide thin films including metal alkyls, metal alkoxides, and metal β-diketonates. Most of the metal-organic precursors have reasonable vapor pressures at relatively low temperatures. Although metal β-diketonates tend to be less volatile than their alkyl equivalents, they are easier to handle and are much less toxic. In this case, there materials need much higher temperature to achieve the high vapor pressure needed for this process and the high temperature complicates the conventional bubbler system because of the degradation of the precursors and expensive bubbler improvements.

A liquid delivery system (LDS) includes transfer the liquid precursors from the source container at ambient temperature through a liquid pump to a vaporization cell (vaporizer) which is heated to a high temperature to obtain the needed high vapor pressure. LDS has several advantages over bubbler systems. It maintains highly accurate and controlled flow conditions. Its delivery is not affected by the temperature of the source. There is no pressure drop across the delivery device. The liquid precursor is not exposed to heat over extended time periods thereby reducing the concern of material decomposition. The need for heated lines is minimized. It allows low vapor-pressure materials to be delivered at high mass flow rates. Material can be delivered to high pressure processes.

For the growth of BiFeO$_3$ thin films by LDS-MOCVD, precursors include Tris(2,2,6,6,-tetramethyl-3,5-heptanedioanoto) bismuth (III) and Tris(2,2,6,6-tetramethyl-3,5-heptanedionato) iron (III), respectively denoted as Bi(thd)$_3$ and Fe(thd)$_3$. Both of them are based on β-diketonates which contain components which facilitate chemical compatibility and exhibit similar thermal behavior.

An MOCVD system including LDS is especially adapted for depositing thin films of complex metal oxides. A showerhead is designed to be heated internally with hot oil to vaporize the liquid precursors and prevent their condensation. The wide extent of the showerhead promotes highly uniform film deposition over 50 mm substrates. A 13-stage heater control system down from the vaporizer adjusts the downstream temperature and thermally stabilizes the system.

Epitaxial BFO thin films were grown by MOCVD systems equipped with liquid delivery systems delivering a liquid precursor of Bi(thd)$_3$ or Fe(thd)$_3$ to the heated substrate. Typical processing conditions included a vaporizer temperature of 190° C., a carrier gas flow rate of 200 sccm, an O$_2$ gas flow rate of 500 sccm, a substrate temperature of between 450 and 750° C., a processing pressure of 2 Torr, and a liquid precursor flow rate of 0.2 ml/min. Growth temperatures of 625 to 650° C. and oxygen partial pressures of 100 to 400 milliTorr provide good results.

Film compositions were tested for different supply ratios of the precursors. A stoichiometric film composition was obtained for volumetric mixing ratio of Bi/(Bi+Fe) of 0.75. The high supply level of the Bi precursor relative to the Fe precursor can be expected because of the high volatility of bismuth and the empirically established vapor pressures of the two precursors:

$$\text{Bi}(thd)_3 : \log P = -\frac{5202.7}{T} + 12.4$$

and $$\text{Fe}(thd)_3 : \log P = -\frac{4842}{T} + 12.5,$$

where the pressure P is expressed in Pa and the temperature T is in °K. At a showerhead temperature of 190° C., the vapor pressure of Fe(thd)$_3$ is about 2.5 times greater than that of Bi(thd)$_3$, generally corresponding to the stoichiometric mixing ratio of 0.75.

Figure 11:
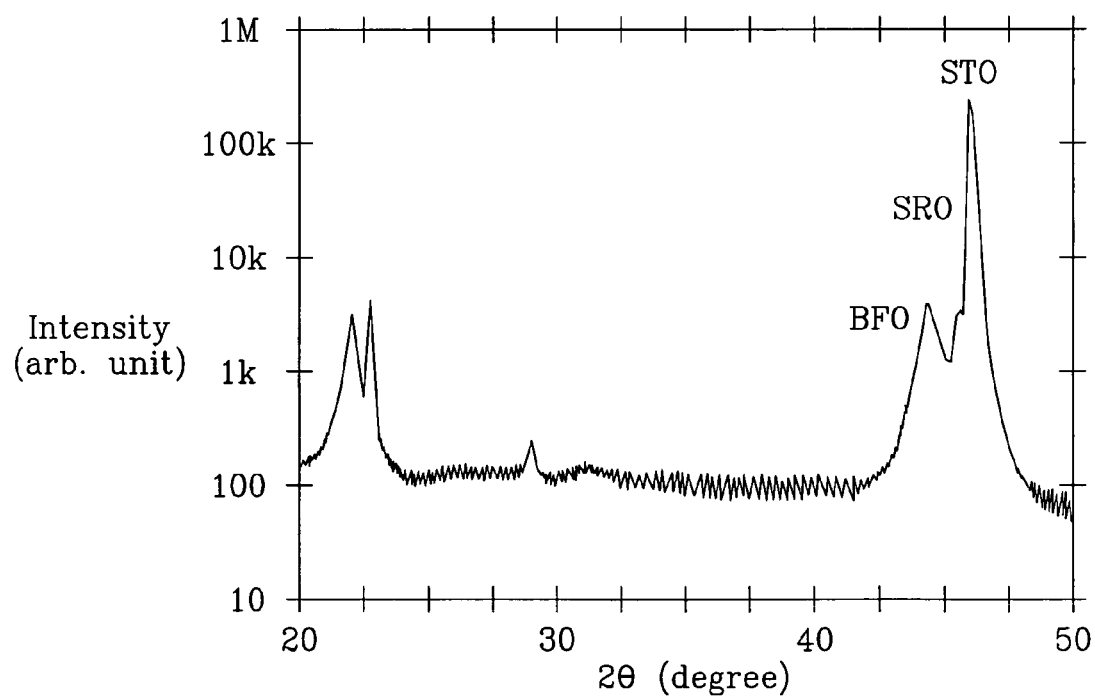
FIG. 11 is an x-ray diffraction pattern of BFO grown by organo-metal chemical vapor deposition.

Bismuth ferrite (BFO) thin films of 70 nm thickness were grown on an electrode layer of strontium ruthenium oxide (SRO), on a templating layer of strontium titanate (STO) over a silicon substrate. The films were highly epitaxial as shown for the θ-2θ x-ray diffraction scan of FIG. 11 and showed only (00l) peaks and no observable second phase.

It is understood that the STO and BFO films as well as the conductive metal oxide films can be grown by methods other than pulsed laser ablation or MOCVD. Furthermore, other conductive metal oxide films may be used but they should preferably continue the crystallographic orientation from the template layer to the BFO layer.

Although STO has been observed to provide an effective template layer for crystalline BFO over silicon and SRO has been observed to provide an effective template layer for polycrystalline silicon over silica, the invention is not so limited. Other electrode materials, especially conductive oxides may be used, for example, lanthanum strontium cobalt oxide (LSCO), lanthanum strontium manganese oxide(LSMO), lanthanum calcium manganese oxide(LCMO), lanthanum nickle oxide (LaNiO$_3$), iridium oxide (IrOx), and other conductive materials mention by Ramesh et al. in U.S. Pat. No. 6,642,539, many of which have a perovskite structure.

The invention thus allows the fabrication of ferroelectric and piezoelectric devices on silicon substrates without the use of lead. However, the invention is not limited to such devices but is defined solely by the following claims.

The invention claimed is:

1. A ferrite structure, comprising:
   a silicon layer;
   a conductive oxide layer grown on the silicon layer to be crystallographically aligned therewith; and
   a ferrite layer comprising bismuth ferrite grown on the oxide layer to be crystallographically aligned therewith.

2. The ferrite structure of claim 1, wherein the ferrite layer is doped with lanthanum.

3. The ferrite structure of claim 1, wherein the oxide layer comprises strontium titanate.

4. The ferrite structure of claim 3, wherein the oxide layer is doped to be electrically conductive.

5. A ferrite structure, comprising:
   a silicon substrate;
   a silicon layer formed on the silicon substrate;
   a barrier layer formed on the silicon layer;
   a conductive metal oxide layer formed on the metal barrier layer; and
   a ferrite layer formed on the metal oxide layer and comprising bismuth ferrite.

6. The ferrite structure of claim 5, wherein the silicon layer comprises polycrystalline silicon.

7. The ferrite structure of claim 6, further comprising a dielectric layer with an aperture therethrough and wherein the silicon layer is a plug formed in the aperture.

8. The ferrite structure of claim 6, wherein the barrier layer comprises strontium titanate.

9. The ferrite structure of claim 6, wherein the barrier layer is doped with lanthanum.

10. The ferrite structure of claim 6, wherein the barrier layer comprises a metal.

11. The ferrite structure of claim 1, wherein the metal barrier layer comprises platinum.

12. The ferrite structure of claim 10, wherein the barrier layer comprises an intermetallic alloy.

13. The ferrite structure of claim 5, wherein the bismuth in the bismuth ferrite layer is substituted by lanthanum in a fraction greater than 5 at % and less than 20 at %.

14. The ferrite structure of claim 5, wherein the conductive metal oxide layer comprises strontium ruthenate.

15. The ferrite structure of claim 5, wherein the conductive metal oxide layer comprises a metal oxide selected from the group consisting of lanthanum strontium cobalt oxide, lanthanum strontium manganese oxide, lanthanum calcium manganese oxide, lanthanum nickel oxide, and iridium oxide.

16. A memory chip, comprising:
   the silicon substrate of claim 5 and having a plurality of active semiconductor devices formed therein;
   a dielectric layer formed over the silicon substrate and having a plurality of apertures extending therethrough in respective regions of the devices; and
   a plurality of ferroelectric cells formed over the dielectric layer and each being formed of the ferrite structure of claim 5 and respectively comprising
      a silicon plug forming the silicon layer and substantially filling a respective one of the apertures and forming the silicon layer,
      an intermetallic layer forming the barrier layer and overlying the silicon plug,
      a lower electrode layer comprising the conductive metal oxide layer and overlying the intermetallic layer,
      a ferroelectric layer forming the ferrite layer and comprising bismuth ferrite overlying the lower electrode layer, and
      an upper electrode layer overlying the ferroelectric layer.

17. The memory chip of claim 16, wherein the silicon plug comprises polysilicon.

18. The memory chip of claim 16, wherein the bismuth in the bismuth titanate is partially cationically substituted.

19. The memory chip of claim 18, wherein the bismuth in the bismuth titanate is substituted with lanthanum in a fraction lying within a range greater than 5 at % and less than 20 at %.

20. The memory chip of claim 15, wherein the lower and upper electrode layers both comprise strontium ruthenate and further comprising a layer of iridium oxide between the intermetallic layer and the lower electrode layer.

21. A ferrite structure, comprising:
   a crystalline silicon layer;
   a conductive oxide layer grown on said silicon layer to be crystallographically aligned therewith; and
   a ferrite layer comprising bismuth ferrite grown on said oxide layer to be crystallographically aligned therewith.

22. The ferrite structure of claim 21, further comprising a first electrode layer disposed between said conductive oxide layer and said ferrite layer and a second electrode layer formed on a side of said ferrite layer opposite said first electrode layer, whereby said two electrode layers form a capacitor with a gap therebetween including said ferrite layer.

23. The ferrite structure of claim 22, configured as a non-volatile memory cell.

24. The ferrite structure of claim 22, configured as a micro electromechanical system.

25. The ferrite structure of claim 21, wherein said conductive oxide layer comprises a perovskite material.

26. The ferrite structure of claim 25, wherein said template conductive oxide layer comprises strontium titanate.

27. The ferrite structure of claim 26, wherein conductive the oxide layer is doped to be conductive.

28. The ferrite structure of claim 21, wherein said first electrode layer comprises strontium ruthenate.

29. The ferrite structure of claim 21, further comprising an electrode layer formed on a side of said ferrite layer opposite said conductive oxide layer.

30. The ferrite structure of claim 21, wherein said layer is doped with lanthanum.

31. The ferrite structure of claim 21, wherein said conductive oxide layer comprises strontium titanate.

32. The ferrite structure of claim 31, wherein said conductive oxide layer is doped to be electrically conductive.

33. A ferrite structure, comprising:
   a silicon substrate;
   a silicon oxide layer formed on said silicon substrate;
   a barrier layer formed on said silicon oxide layer;
   a conductive metal oxide layer formed on said metal barrier layer; and
   a ferrite layer formed on said metal oxide layer and comprising bismuth ferrite.

34. The ferrite structure of claim 33, wherein said barrier layer comprises strontium titanate.

35. The ferrite structure of claim 33, wherein said barrier layer comprises a metal.

36. The ferrite structure of claim 35, wherein said metal barrier layer comprises platinum.

37. The ferrite structure of claim 35, wherein said metal barrier layer comprises an intermetallic alloy.

38. A ferrite structure, comprising:
   a silicon layer;
   a strontium titanate layer formed on said silicon layer, and
   a ferrite layer comprising bismuth ferrite formed over said strontium titanate layer.

39. The ferrite structure of claim 38, further comprising:
   a lower electrode layer comprising a conductive metal oxide and formed on said strontium titanate layer, wherein said ferroelectric layer is formed on said lower electrode layer; and
   an upper electrode layer formed on said functional layer.

40. The ferrite structure of claim 39, wherein said ferrite layer is doped with lanthanum.

41. The ferrite structure of claim 39, wherein said conductive metal oxide comprises strontium ruthenate.

42. The ferrite structure of claim 39, wherein said ferrite layer has a thickness of no more than 400 nm.

43. The ferrite structure of claim 39, further comprising a semiconductor circuit formed in said silicon layer and electrically connected to said lower electrode layer.

44. The ferrite structure of claim 39, wherein an aperture is formed through said silicon layer to suspend said electrode layers and said ferrite layer over said aperture.

45. A crystalline bismuth ferrite structure, comprising:
   a crystalline silicon layer having a (100) orientation;
   a first layer comprising strontium titanate formed on said silicon layer to be crystallographically aligned thereto with a 45° crystallographic offset; and
   a bismuth ferrite layer comprising bismuth, iron and oxygen formed on said first layer and crystallographically aligned therewith.

46. The structure of claim 45, further comprising a conductive metal oxide layer disposed between said first layer and said bismuth ferrite layer.

47. The structure of claim 46, wherein said conductive metal oxide layer comprises strontium ruthenate.

48. The structure of claim 45, wherein said bismuth ferrite layer is doped with lanthanum.

49. The structure of claim 45, wherein said first layer is doped to be conductive.

50. A ferrite memory structure, comprising:
   a crystalline silicon layer;
   a conductive oxide layer deposited on the silicon layer to be crystallographically aligned therewith;
   a lower electrode layer deposited on the conductive oxide layer to be crystallographically aligned therewith;
   a ferroelectric layer comprising bismuth ferrite deposited on the lower electrode layer to be crystallographically aligned with the conductive oxide layer; and
   an upper electrode layer deposited on the ferroelectric layer, wherein the two electrode layers and the ferroelectric layer form a capacitive memory cell.

51. The ferrite memory structure of claim 50, wherein the conductive oxide layer comprises strontium titanate.

52. The ferrite memory structure of claim 50, wherein the lower electrode layer comprises one of strontium ruthenate, lanthanum strontium cobalt oxide, lanthanum strontium manganese oxide, lanthanum calcium manganese oxide, lanthanum nickel oxide, and iridium oxide.

* * * * *